United States Patent
Liu et al.

(10) Patent No.: US 9,851,636 B2
(45) Date of Patent: Dec. 26, 2017

(54) MATERIALS AND METHODS FOR IMPROVED PHOTORESIST PERFORMANCE

(75) Inventors: Chen-Yu Liu, Kaohsiung (TW); Ching-Yu Chang, Yuansun Village (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 6 days.

(21) Appl. No.: 13/542,160

(22) Filed: Jul. 5, 2012

(65) Prior Publication Data
US 2014/0011133 A1 Jan. 9, 2014

(51) Int. Cl.
G03F 7/004 (2006.01)
G03F 7/016 (2006.01)
G03F 7/038 (2006.01)
G03F 7/039 (2006.01)

(52) U.S. Cl.
CPC .......... G03F 7/0045 (2013.01); G03F 7/0163 (2013.01); G03F 7/0382 (2013.01); G03F 7/0392 (2013.01)

(58) Field of Classification Search
CPC ..... G03F 7/0045; G03F 7/0392; G03F 7/0163
USPC ...................... 430/270.1, 919, 920, 921, 922
See application file for complete search history.

(56) References Cited

U.S. PATENT DOCUMENTS

| | | | |
|---|---|---|---|
| 7,252,924 B2 * | 8/2007 | Yamanaka et al. | ........ 430/270.1 |
| 2011/0027716 A1 * | 2/2011 | Yamaguchi | ........... C07C 309/06 |
| | | | 430/270.1 |
| 2011/0217654 A1 | 9/2011 | Yamato et al. | |
| 2011/0229832 A1 | 9/2011 | Kamimura et al. | |

\* cited by examiner

*Primary Examiner* — John S Chu
(74) *Attorney, Agent, or Firm* — Haynes and Boone, LLP (57) ABSTRACT

A photosensitive material and methods of making a pattern on a substrate are disclosed. The photosensitive material includes a polymer that turns soluble to a developer solution after a chemically amplified reaction, and at least one chemical complex having a single diffusion length. The material includes at least one photo-acid generator (PAG) linked to at least one photo decomposable base (PDB) or quencher.

20 Claims, 6 Drawing Sheets

MATERIALS AND METHODS FOR IMPROVED PHOTORESIST PERFORMANCE

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, conventional photoresist layers comprise a base, which is not photosensitive. Thus, after an exposure process, exposed areas of a photoresist layer may exhibit less than desirable acid distribution contrast and base distribution contrast. This leads to lower pattern contrast, resulting in poor pattern profiles and/or poor resolution, particularly as pattern features continue to decrease in size.

Conventional methods for improving resolution usually include using a quencher, photo decomposable base (PDB) or photo decomposable quencher (PDQ) and a photo-acid generator (PAG) in the photoresist layer. The quencher is a base molecule that can neutralize the acid to quench a chemically amplified reaction (CAR). The PDB or PDQ is a base and typically becomes less basic after exposure. The PAG generates an acid after exposure. Different diffusions of the quencher, PDB, and the PAG often result in a loss of contrast in the final pattern. In addition, this difference can cause loss in pattern uniformity and produce poor lithographic performance, such as poor critical dimension uniformity (CDU), poor depth of focus (DOF), poor pattern fidelity, pattern scum, and increased roughness.

Accordingly, what is needed is a method and photoresist material for manufacturing an integrated circuit device that addresses the above stated issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides a lithography method for use in manufacturing a semiconductor device. The terms lithography, immersion lithography, photolithography, and optical lithography may be used interchangeably in the present disclosure. Photolithography is a process used in microfabrication, such as semiconductor fabrication, to selectively remove parts of a thin film or a substrate. The process uses light to transfer a pattern (e.g., a geometric pattern) from a photomask to a light-sensitive layer (e.g., photoresist, or simply "resist") on the substrate. The light causes a chemical change in exposed regions of the light-sensitive layer, which may increase or decrease solubility of the exposed regions. If the exposed regions become more soluble, the light-sensitive layer is referred to as a positive photoresist. If the exposed regions become less soluble, the light-sensitive layer is referred to as a negative photoresist. Baking processes may be performed before or after exposing the substrate, such as a post-exposure baking process. A developing process selectively removes the exposed or unexposed regions with a developing solution creating an exposure pattern over the substrate. A series of chemical treatments may then engrave/etch the exposure pattern into the substrate (or material layer), while the patterned photoresist protects regions of the underlying substrate (or material layer). Alternatively, metal deposition, ion implantation, or other processes can be carried out. Finally, an appropriate reagent removes (or strips) the remaining photoresist, and the substrate is ready for the whole process to be repeated for the next stage of circuit fabrication. In a complex integrated circuit (for example, a modern CMOS), a substrate may go through the photolithographic cycle a number of times.

Figure 1:
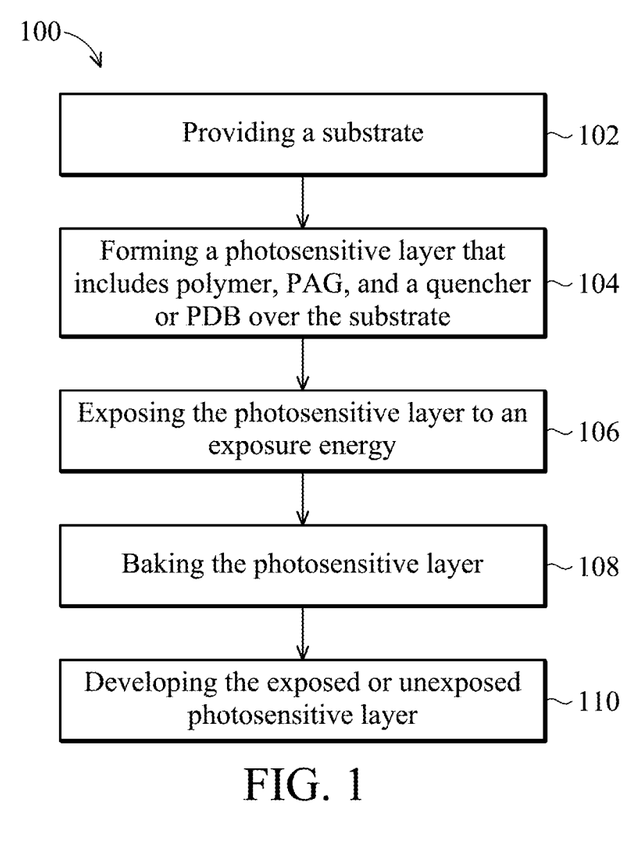
FIG. 1 is a flowchart of a method for forming a pattern on a substrate constructed according to aspects of the present disclosure.
Figure 2:
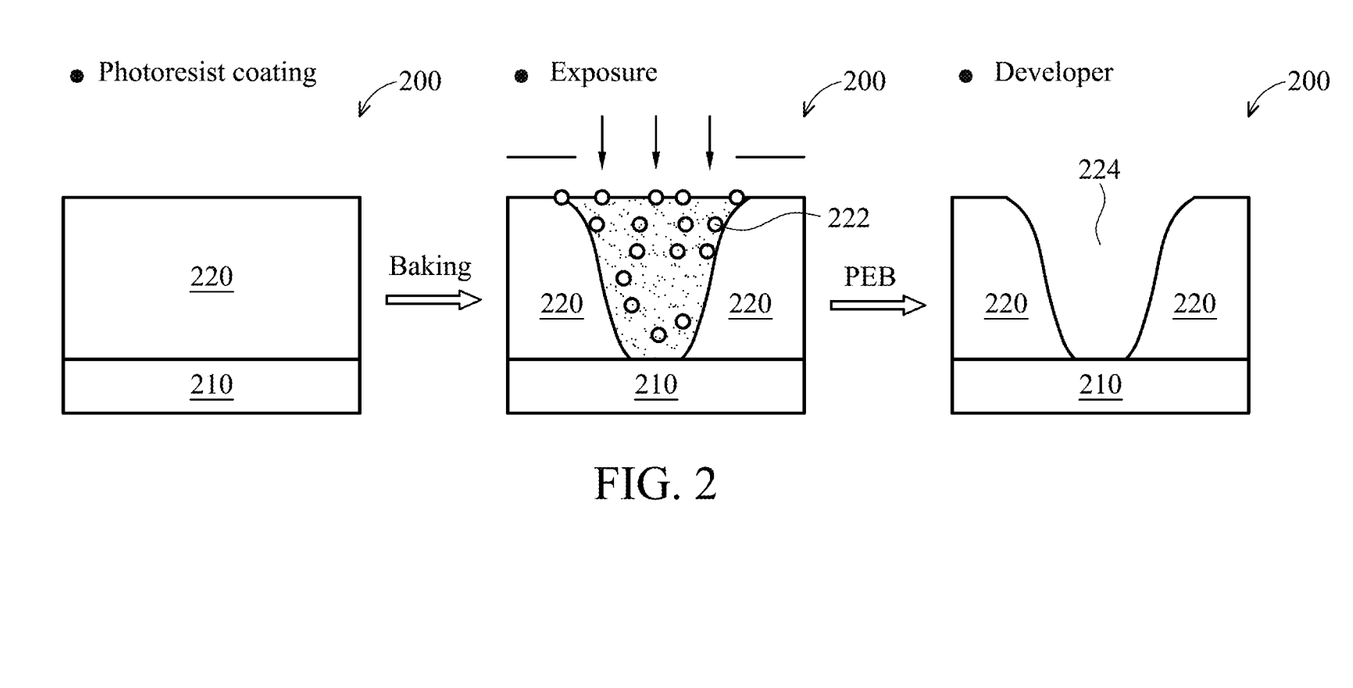
FIG. 2. illustrates sectional views of a semiconductor substrate having a photosensitive layer at various stages of a lithography process constructed according to aspects of the present disclosure in an embodiment.

FIG. 1 describes a method 100, and FIG. 2 describes an embodiment of a device 200 that is processed according to the method of FIG. 1. The method 100 begins at block 102 by providing a substrate. In the embodiment shown in FIG. 2, the substrate is a semiconductor substrate 210 such as a semiconductor wafer or other suitable device. In the present embodiment, the semiconductor substrate 210 may be made from any suitable semiconductor material, and include various features such as various doped regions, dielectric features, and/or multilevel interconnects.

Figure 3:
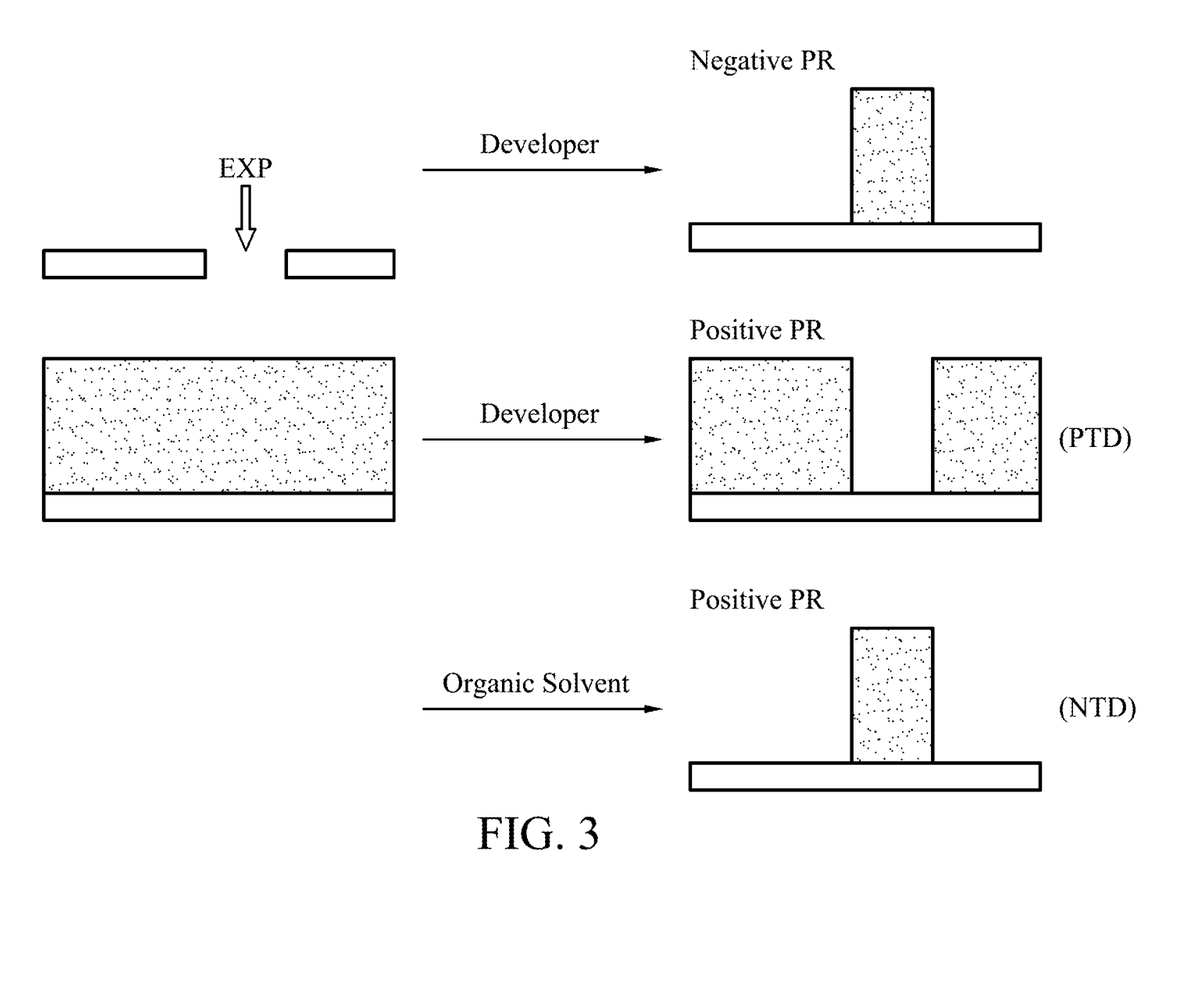
FIG. 3 illustrates positive and negative photoresists, and positive-tone and negative-tone development according to aspects of the present disclosure in an embodiment.

The method 100 proceeds to step 104, where a photosensitive layer containing a polymer, PAG, and a quencher or PDB is formed. Referring to FIG. 2, a photosensitive material layer (or photosensitive layer, photoresist layer or resist layer) 220 is disposed on the substrate 210. For example, a spin-coating technique is utilized to form the photosensitive layer 220 on the substrate 210. The photoresist layer is a positive-type or negative-type resist material and may have a multi-layer structure. The photosensitive layer 220 utilizes a chemically amplified reaction (CAR) resist material. In one embodiment, a positive CAR resist material includes a polymer material that turns soluble to a developer such as a base solution after the polymer is reacted with acid. Two types of developing solutions may be used with a positive CAR resist material, a positive-tone developer or a negative-tone developer. An irradiated part is dissolved in a developer in the positive-tone system while a non-irradiated part is dissolved in an organic solvent in the negative-tone system. Alternatively, the CAR resist material can be negative and include a polymer material that turns insoluble to a developer such as a base solution after the polymer is reacted with acid. FIG. 3 illustrates the differences between negative and positive photoresist (PR) materials, and positive-tone development (PTD) and negative-tone development (NTD). The photosensitive layer 220 further includes a solvent filling inside the polymer. The solvent may be partially evaporated by a soft baking process. The photosensitive layer 220 also includes PAG distributed in the photosensitive layer 220. When absorbing photo energy, the PAG decomposes and forms a small amount of acid 222. The photosensitive layer 220 also includes a quencher or PDB (not shown) distributed in the photosensitive layer 220. The PDB forms a weak acid to neutralize its base or become a weak base after exposure, and is present in any suitable concentration, as is known in the art. A quencher may be used in place of a PDB, as is known in the art.

In the exposing process step 106, the photosensitive layer 220 is exposed to an exposure energy such as deep ultraviolet (DUV) through a photomask (mask or reticle) having a predefined pattern, resulting in a resist pattern that includes a plurality of exposed regions such as exposed features and a plurality of unexposed regions. In one embodiment, the exposure beam used to expose the photosensitive layer 220 includes extreme ultraviolet (EUV) exposure and/or electron-beam (e-beam) writing. Alternatively, the exposure process may utilize other exposure beams, such as ion beam, x-ray, deep ultraviolet, and other proper exposure energy.

The nature of the PAGs is such that the exposure energy resulting from the exposure is sufficient to activate the PAGs in the exposed areas. The PDB is also activated in the exposed areas during the exposure.

Subsequently, the photoresist layer 220 may be subjected to a post-exposure bake (PEB) process step 108. The coated photosensitive layer may be baked in a step, to de-protect the polymer leaving group composed in the photosensitive layer 220.

The method proceeds to step 110, where the photosensitive layer 220 is developed by any suitable process to form a pattern in the photosensitive layer. A developing solution may be utilized to remove portions of the photosensitive layer. The developing solution may remove the exposed or unexposed portions depending on the resist type. If the photosensitive layer comprises a negative-type resist, the exposed portions are not dissolved by the developing solution and remain over the substrate. If the photosensitive layer includes a positive-type resist, the exposed portions would be dissolved by a positive-tone developing solution, leaving the unexposed portions behind. With a negative-tone developing solution, the unexposed portions would be dissolved, leaving the exposed portions. The remaining exposed portions (or unexposed portions) define a pattern. The patterned photoresist may then be removed (or stripped) by any suitable process.

After a pattern exposure and/or PEB process, the PAG in the photosensitive layer (i.e., photoresist) produces an acid and thus increases or decreases polymer solubility. The solubility may be increased for positive tone resist (i.e., the acid will cleave an acid cleavable polymer, resulting in the polymer becoming more hydrophilic) and decreased for negative tone resist (i.e., the acid will catalyze an acid catalyzed crosslinkable polymer, resulting in the polymer becoming more hydrophobic).

Generation of strong acid by the PAG creates microscopic acid concentration gradients in the photoresist. Acid mobility during baking results in a more homogenous acid distribution due to its higher free thermal energy, but simultaneously degrades the acid concentration contrast between the exposed and unexposed areas. The PDB also reacts and generates a weak acid or weak base. The PDB buffers or neutralizes the acid generated during exposure and affects the availability of generated acid molecules. The PDB helps to improve the acid/base contrast between exposed and unexposed areas.

Figure 4A:
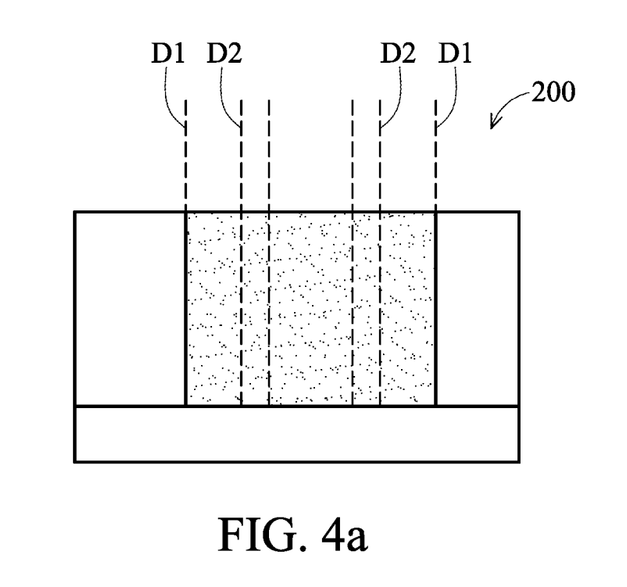
FIG. 4a illustrates two diffusion lengths in a photosensitive layer.

However, because the molecular structures of the PAG and PDB are different, the diffusion length of the PAG and PDB will also be different. This difference in diffusion length between the PAG and the PDB causes loss in chemical contrast and uniformity and induces worse lithography performance, such as worse CDU, worse DOF, and worse roughness, as is shown in FIG. 4a. FIG. 4a shows two different diffusion lengths, D1 and D2, which leads to poor lithography performance.

Figure 4B:
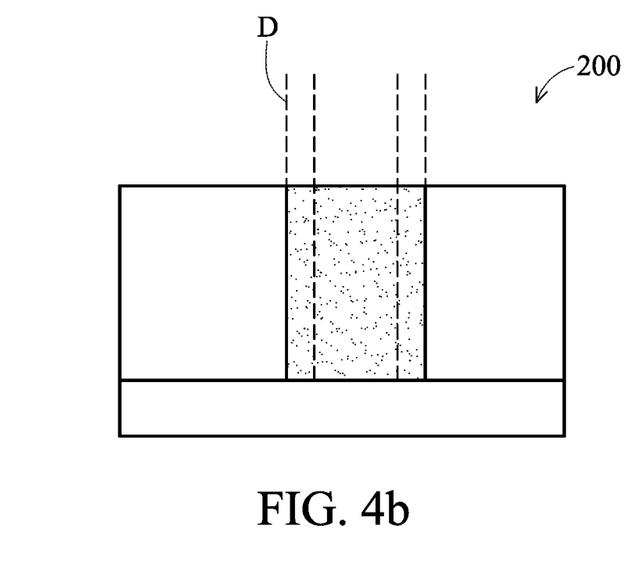
FIG. 4b illustrates a single diffusion length according to aspects of the present disclosure in an embodiment.

To reduce loss of contrast, resolution, and uniformity caused by the difference in diffusion length between PAG and PDB, a photosensitive material with a single diffusion length of PAG and PDB is desired. In the present embodiment, a bi-functional molecule or compound that links the PAG to the PDB by chemical bonding is provided. In an alternative embodiment, a PAG and PDB with substantially similar diffusion lengths are selected for the photosensitive layer 220. Both embodiments are discussed further below. As shown in FIG. 4b, a single diffusion length D is achieved in the present disclosure, which improves contrast and resolution.

Figure 5:
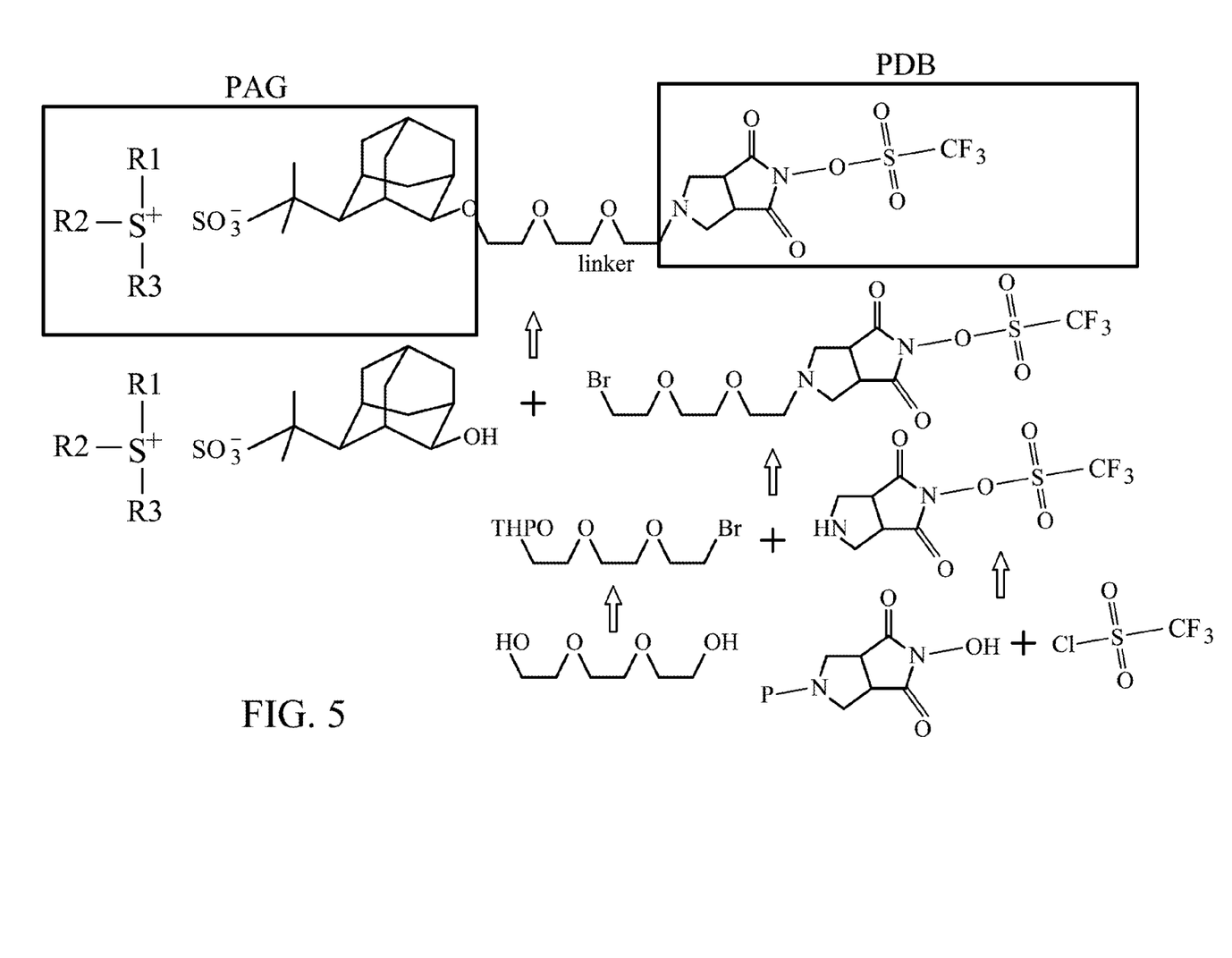
FIG. 5 illustrates a bi-functional molecule in a photosensitive layer according to aspects of the present disclosure in an embodiment.
Figure 6:
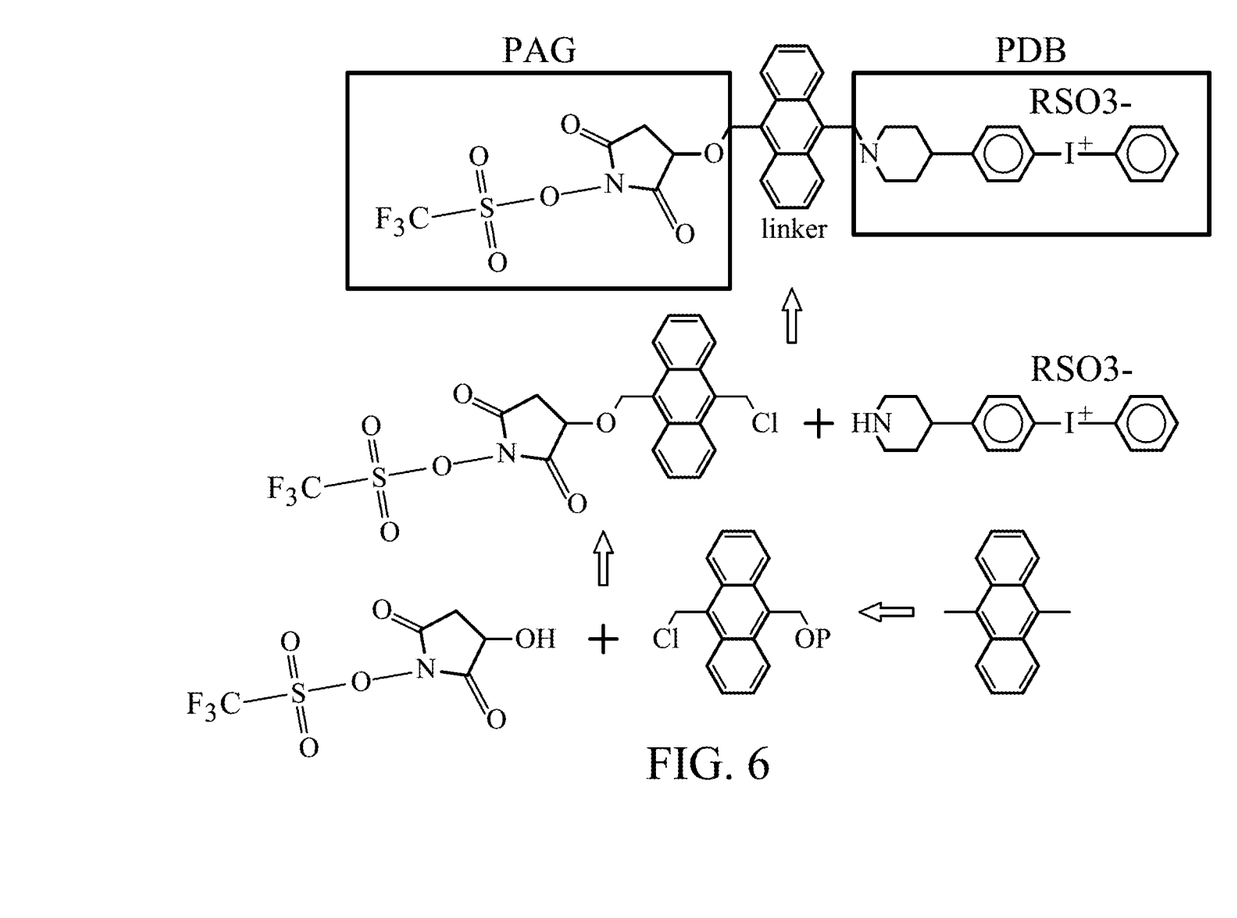
FIG. 6 illustrates a bi-functional molecule in a photosensitive layer according to aspects of the present disclosure in an embodiment.

In the first embodiment, the PAG and PDB are bound or linked together to form a new bi-functional molecule or compound. They may be bound or linked by dipole-dipole interactions, hydrogen bonding, metallic bonding, or covalent bonding. The covalent bond can include any atom, halogen, substituted and unsubstituted alkyl, substituted and unsubstituted aryl, substituted and unsubstituted heteroaryl, or substituted and unsubstituted heterocycloalkyl. In an exemplary embodiment, the PAG is covalently linked to the PDB through a linking compound to form a bi-functional compound. The linking compound may be selected from a substituted or unsubstituted alkyl, a halogen atom, substituted or unsubstituted aryl, substituted or unsubstituted heteroaryl, and substituted or unsubstituted heterocycloalkyl. FIGS. 5 and 6 illustrate two exemplary bi-functional molecules, and their method of preparation.

In FIG. 5, $R^1$, $R^2$, and $R^3$ are each independently selected from a group consisting of an unsubstituted or substituted alkyl group or aryl group. Specific examples include a $C_1$-$C_6$ alkyl group, a $C_6$-$C_{14}$ aryl group, and substituted derivatives thereof. Examples of the substituent on the alkyl group include a $C_1$-$C_8$ alkoxy group, a $C_1$-$C_8$ alkyl group, nitro group, halogen atom, carboxyl group, and a hydroxyl group. Examples of the substituent on the aryl group include a $C_1$-$C_8$ alkoxy group, carboxyl group, an alkoxycarbonyl group, a $C_1$-$C_8$ haloalkyl group, a $C_5$-$C_8$ cycloalkyl group and a $C_1$-$C_8$ alkylthio group. Two of $R_1$, $R_2$, and $R_3$ may be connected to each other by single bond or a substituent.

In FIG. 6, R includes alkyl ($C_1$-$C_{12}$), admantane, perfluoroalkyl, such as perfluoro, particularly perfluoro counter anions of perfluoroheptanesulfonate and the like.

The bi-functional molecule exhibits both the PAG and PDB properties. Moreover, the bi-functional molecule has only a single diffusion length, which improves uniformity and contrast of the pattern on the photosensitive layer. This, in turn, improves photoresist performance, including CDU, roughness, and profile.

Examples of the PAG, that is, a compound capable of generating an acid upon exposure, are given below. It should be understood that they may be used alone or in admixture of two or more. Suitable PAGs include onium salts, selenium salts, phosphonium salts, iodinium, sulfonium salts, organic halogen compounds, O-nitrobenzylsulfonate compounds, N-iminosulfonate compounds, N-imidosulfonate compounds, diazosulfonate compound, sulfonimide compounds, diazodisulfonate compounds, and disulfone compounds.

In an exemplary embodiment, the PAG is represented by one of the following structures:

$R^1$-$R^{33}$ may be the same or different and each represents a hydrogen atom, an alkyl group having 1 to 20 carbon atoms, an aminoalkyl group having 1 to 20 carbon atoms, a hydroxyalkyl group having 1 to 20 carbon atoms, or a substituted or unsubstituted aryl group having 1 to 20 carbon atoms. $R^1$-$R^{33}$ may bind together to form a ring. $X^-$ represents a counter ion, such as $BF^{-4}$, $AsF_6$, $PF^{-6}$, $SBF_6$, $SiF^{-6}$, $ClO^{-4}$, perfluoroalkanesulfonic acid anion, alkylsulfoni anion, armomatic sulfonic acid anion, benzesulfonic acid anion or triisopropylbenzenesulfonic anion, a condensed polycyclic aromatic sulfonic acid anion, or a dye containing sulfonic acid. $Ar^1$ and $Ar^2$ may be the same or different, each representing an unsubstituted or substituted aryl group. A represents an unsubstituted or substituted alkylene group, a substituted or unsubstituted alkylene group or a substituted or unsubstituted arylene group. $I^+$ represents the iodonium ion. Y represents a chlorine or bromine atom.

The photosensitive layer 220 further includes a PDB in any suitable amount, as is known in the art. The PDB is any compound that can trap an extra proton in the exposure and non-exposure areas. The main purpose of the PDB is to neutralize the low levels of acid that may diffuse into unexposed areas. After exposure, the PDB is depleted in the exposure area. The PDB may be activated by a laser, active ray, irradiation, or any kind of light source, and generate a weak acid or weak base with a pKa larger than 4. In one embodiment, the PDB includes a nitrogen-containing compound, which can be reacted to form ammonium, which is a weak base after exposure. In another embodiment, the PDB includes a nitrogen-containing compound with two or more nitrogen atoms having different chemical environments in one molecule. In an exemplary embodiment, the PDB is a compound having an alkyl amino group, or a compound containing both a substituted and unsubstituted amino group and a nitrogen-containing ring.

The PDB may be selected from substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, an imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine. Substituents may be selected from an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

In an exemplary embodiment, the PDB is represented by the following formulas:

Formula (a)

Formula (b)

Formula (c)

-continued

Formula (d)

Formula (e)

$R^1$-$R^7$ may be the same or different and each represents a hydrogen atom, an alkyl group having 1 to 20 carbon atoms, an aminoalkyl group having 1 to 20 carbon atoms, a hydroxyalkyl group having 1 to 20 carbon atoms, or a substituted or unsubstituted aryl group having 1 to 20 carbon atoms. $R^1$-$R^7$ may bind together to form a ring. Formulas (b)-(e) may be a part of a ring structure.

In the second embodiment, the PAG and the PDB are not necessarily linked or bound, but are selected to have substantially similar diffusion lengths. By "substantially similar" is meant that the two diffusion lengths differ by less than ten percent. In an exemplary embodiment, the two diffusion lengths differ by less than five percent. The resulting contrast and uniformity of the final pattern are improved. It has been demonstrated that a significant CDU improvement is obtained.

Selecting a PAG and PDB with substantially similar diffusion length controls acid mobility after exposure. The mobility of the PDB is substantially similar to the mobility of the PAG to ensure that the PDB is in the same areas as the PAG.

The present disclosure provides various methods and photosensitive materials for lithography patterning. It should be understood that a variety of different patterns can be formed using the presently disclosed methods. By selecting the type of PAG and the PDB, CDU can be improved. In one embodiment, a single diffusion length of the PAG and the PDB can be achieved by linking the PAG and the PDB. In another embodiment, the PAG are selected to have substantially similar diffusion lengths. The present methods provide better control over the overall acid and base distribution that occurs during an exposure process. The acid and base distribution may be modified to enhance the final acid distribution, which provides improved acid/base distribution contrast, resulting in an improved pattern profile. The modified acid/base distribution particularly improves resolution (contrast) of the resulting pattern.

The present disclosure relates to a photosensitive material with improved properties. The material includes a polymer that turns soluble to a developer solution after a CAR, and at least one chemical complex including at least one photo-acid generator (PAG) linked to at least one photo decomposable base (PDB) or quencher. The complex has a single diffusion length.

In another embodiment, the photosensitive material includes a polymer that turns soluble to a developer solution after a CAR, at least one PAG, and at least one PDB or quencher. The PAG and PDB or quencher are selected to have substantially similar diffusion lengths.

The present disclosure also relates to a method for forming a pattern on a substrate. The method includes providing a substrate, forming a photosensitive layer over the substrate, exposing the photosensitive layer to an exposure energy, baking the photosensitive layer, and developing the exposed or unexposed photosensitive layer. The photosensitive layer includes a polymer that turns soluble to a developer solution, at least one PAG linked to at least one PDB by a linking compound to form a bi-functional compound with a single diffusion length.

Other variations in this spirit and scope are considered as consistent with the present disclosure and are suggestive. For example, the lithography patterning methods can be used to pattern one material layer disposed on a semiconductor wafer. This material layer can include silicon, silicon oxide, silicon nitride, titanium nitride, silicon oxynitride, metal oxide (e.g. aluminum oxide or hafnium oxide), metal nitride, metal oxynitride, or siloxane. An additional material layer, such as bottom anti-reflective coating (BARC), silicon hard mask (ML) combining organic under layer (UL), may be formed on the substrate before forming the photosensitive layer(s). The photosensitive material can be positive tone or alternatively negative tone.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A photosensitive material, comprising:
    a polymer that turns soluble to a developer solution after a chemically amplified reaction; and
    at least one chemical complex comprising at least one photo-acid generator (PAG), at least one photo decomposable base (PDB) or quencher, and a linking compound that links the PAG to the PDB or quencher through covalent bonding, the linking compound being a polyethylene glycol,
    wherein the chemical complex has a single diffusion length.

2. The photosensitive material of claim 1, wherein the PDB comprises a nitrogen-containing compound.

3. The photosensitive material of claim 2, wherein the PDB is represented by Formula (a), (b), (c), (d), or (e):

Formula (a)

Formula (b)

Formula (c)

Formula (d)

Formula (e)

wherein $R^1$-$R^7$ are the same or different and each represents a hydrogen atom, an alkyl group having 1 to 20 carbon atoms, an aminoalkyl group having 1 to 20 carbon atoms, a hydroxyalkyl group having 1 to 20 carbon atoms, or a substituted or unsubstituted aryl group having 1 to 20 carbon atoms, and $R^1$-$R^7$ are capable of binding together to form a ring.

4. The photosensitive material of claim 2, wherein the nitrogen-containing compound comprises two or more nitrogen atoms.

5. The photosensitive material of claim 4, wherein the nitrogen containing compound is selected from the group consisting of a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, an imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine.

6. The photosensitive material of claim 5, wherein substituents on the nitrogen containing compound are selected from the group consisting of an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

7. The photosensitive material of claim 1, wherein the PAG is selected from the group consisting of onium salts, selenium salts, phosphonium salts, iodinium, sulfonium salts, organic halogen compounds, O-nitrobenzylsulfonate compounds, N-iminosulfonate compounds, N-imidosulfonate compounds, diazosulfonate compound, sulfonimide compounds, diazodisulfonate compounds, and disulfone compounds.

8. The photosensitive material of claim 1, wherein the PAG is represented by one of the following structures:

wherein $R^1$-$R^{33}$ are the same or different and each represents a hydrogen atom, an alkyl group having 1 to 20 carbon atoms, an aminoalkyl group having 1 to 20 carbon atoms, a hydroxyalkyl group having 1 to 20 carbon atoms, or a substituted or unsubstituted aryl group having 1 to 20 carbon atoms, and $R^1$-$R^{33}$ is capable of binding together to form a ring;

$X^-$ represents a counter ion comprising $BF^{-4}$, $AsF_6$, $PF^{-6}$, $SBF_6$, $SiF^{-6}$, $ClO^{-4}$, perfluoroalkanesulfonic acid anion, alkylsulfoni anion, armomatic sulfonic acid anion, benzesulfonic acid anion or triisopropylbenzenesulfonic anion, a condensed polycyclic aromatic sulfonic acid anion, or a dye containing sulfonic acid;

$Ar^1$ and $Ar^2$ are the same or different, each representing an unsubstituted or substituted aryl group;

A represents an unsubstituted or substituted alkylene group, a substituted or unsubstituted alkylene group, or a substituted or unsubstituted arylene group; and Y represents a chlorine or bromine atom.

9. A photosensitive material, comprising:
a polymer that turns soluble to a developer solution after a chemically amplified reaction;
at least one photo-acid generator (PAG); and
at least one photo decomposable base (PDB) or quencher, wherein the PAG and the PDB or quencher have substantially similar diffusion lengths, wherein the at least one PAG is linked to the at least one PDB or quencher by a linking agent, wherein the linking agent is a polyethylene glycol or a polycyclic aromatic hydrocarbon.

10. The photosensitive material of claim 9, wherein the PDB comprises a nitrogen-containing compound.

11. The photosensitive material of claim 10, wherein the nitrogen containing compound is selected from the group consisting of a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, an imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine.

12. The photosensitive material of claim 9, wherein the PAG is selected from the group consisting of onium salts, selenium salts, phosphonium salts, iodinium, sulfonium salts, organic halogen compounds, O-nitrobenzylsulfonate compounds, N-iminosulfonate compounds, N-imidosulfonate compounds, diazosulfonate compound, sulfonimide compounds, diazodisulfonate compounds, and disulfone compounds.

13. A photosensitive material comprising:
a polymer that turns soluble to a developer solution after a chemically amplified reaction;
a photo-acid generator; and
a material selected from the group consisting of a photo decomposable base and a quencher, wherein the photo-acid generator is linked to the material by a polycyclic aromatic hydrocarbon.

14. The photosensitive material of claim 13, wherein the material selected is the photo decomposable base.

15. The photosensitive material of claim 13, wherein the material selected is the quencher.

16. The photosensitive material of claim 13, wherein the photo-acid generator linked to the material has a single diffusion length.

17. The photosensitive material of claim 9, wherein the linking agent is the polyethylene glycol.

18. The photosensitive material of claim 17, wherein the polyethylene glycol has the following structure:

19. The photosensitive material of claim 9, wherein the linking agent is the polycyclic aromatic hydrocarbon.

20. The photosensitive material of claim 19, wherein the polycyclic aromatic hydrocarbon has the following structure:

* * * * *